(12) United States Patent
Han et al.

(10) Patent No.: US 7,763,885 B2
(45) Date of Patent: Jul. 27, 2010

(54) ORGANIC THIN FILM TRANSISTOR HAVING SURFACE-MODIFIED CARBON NANOTUBES

(75) Inventors: Kook Min Han, Yongin-si (KR); Kyu Yeol In, Yongin-si (KR); Jong Jin Park, Yongin-si (KR); Hyun Sik Moon, Yongin-si (KR); Sang Yoon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 25 days.

(21) Appl. No.: 11/898,977

(22) Filed: Sep. 18, 2007

(65) Prior Publication Data

US 2009/0121216 A9    May 14, 2009

Related U.S. Application Data

(60) Continuation-in-part of application No. 11/798,023, filed on May 9, 2007, which is a division of application No. 10/786,592, filed on Feb. 26, 2004, now Pat. No. 7,229,747.

(30) Foreign Application Priority Data

Nov. 30, 2006    (KR) ..................... 10-2006-0119799

(51) Int. Cl.
    *H01L 51/10*      (2006.01)
(52) U.S. Cl. .......... 257/40; 257/E51.008; 257/E51.027; 438/99; 977/745

(58) Field of Classification Search .................... 257/40
See application file for complete search history.

(56) References Cited

U.S. PATENT DOCUMENTS

| 5,981,970 | A | 11/1999 | Dimitrakopoulos et al. | |
|---|---|---|---|---|
| 6,344,660 | B1 | 2/2002 | Dimitrakopoulos et al. | |
| 6,344,662 | B1 | 2/2002 | Dimitrakopoulos et al. | |
| 2003/0047729 | A1* | 3/2003 | Hirai et al. | 257/40 |
| 2004/0071624 | A1* | 4/2004 | Tour et al. | 423/447.1 |
| 2004/0150312 | A1* | 8/2004 | McElrath et al. | 313/310 |
| 2004/0265755 | A1* | 12/2004 | Park et al. | 430/322 |
| 2005/0095466 | A1* | 5/2005 | Minteer et al. | 429/12 |
| 2006/0151781 | A1* | 7/2006 | Kim et al. | 257/40 |
| 2007/0099333 | A1* | 5/2007 | Moriya | 438/96 |

* cited by examiner

*Primary Examiner*—Fernando L Toledo
*Assistant Examiner*—Mamadou Diallo
(74) *Attorney, Agent, or Firm*—Harness, Dickey & Pierce, P.L.C.

(57) ABSTRACT

An organic thin film transistor may comprise an organic semiconductor layer having surface-modified carbon nanotubes and an electrically-conductive polymer. The surfaces of the carbon nanotubes may be modified with curable functional groups, comprising oxirane groups and anhydride groups. A room-temperature solution process may be used to provide a relatively uniform and relatively highly-adhesive organic semiconductor layer in a simple and economical manner. Additionally, the organic thin film transistor having the organic semiconductor layer may have relatively high charge carrier mobility and relatively low threshold voltage.

19 Claims, 2 Drawing Sheets

ORGANIC THIN FILM TRANSISTOR HAVING SURFACE-MODIFIED CARBON NANOTUBES

This non-provisional application claims priority under 35 U.S.C. §119(a) to Korean Patent Application No. 10-2006-0119799, filed on Nov. 30, 2006 in the Korean Intellectual Property Office (KIPO), the entire contents of which are incorporated herein by reference.

This non-provisional application also claims priority under 35 U.S.C. §120 as a continuation-in-part of U.S. application Ser. No. 11/798,023, filed on May 9, 2007, which is a divisional of U.S. application Ser. No. 10/786,592, filed Feb. 26, 2004, now U.S. Pat. No. 7,229,747, issued Jun. 12, 2007, which claims priority under 35 U.S.C. §119(a) to Korean Application No. 10-2003-0011898, filed Feb. 26, 2003.

BACKGROUND OF THE INVENTION

1. Technical Field

Example embodiments relate to a thin film transistor structure having an organic semiconductor layer.

2. Description of the Related Art

Increased interest has been generated regarding organic semiconductors since polyacetylene, as a conjugated organic polymer, was shown to exhibit semiconductor characteristics. As a result, organic semiconductors have been researched for a wide variety of applications (e.g., functional electronic devices and optical devices) because of their relative ease of molding into fibers and films, improved flexibility, relatively high conductivity, and/or relatively low production costs. Organic thin film transistors have especially been the subject of intense research.

An organic thin film transistor (OTFT) may comprise a substrate, a gate electrode, a gate insulating layer, source/drain electrodes, and an organic semiconductor layer. Organic thin film transistors may be classified as bottom contact (BC) organic thin film transistors, wherein an organic semiconductor layer is provided on source/drain electrodes; top contact (TC) organic thin film transistors, wherein source/drain electrodes are provided on an organic semiconductor layer (e.g., by mask deposition); or top gate (TG) organic thin film transistors, wherein a gate electrode is provided on a gate insulating layer.

The semiconductor layers of organic thin film transistors may be formed by printing processes at ambient pressure, unlike the semiconductor layers of silicon thin film transistors which may involve conventional silicon processes, including plasma-enhanced chemical vapor deposition (PECVD). Additionally, the overall fabrication procedure may be achieved by relatively economical roll-to-roll processes using plastic substrates. Accordingly, organic thin film transistors may be useful for various applications, including driving devices for active displays and plastic chips for smart cards and inventory tags.

However, organic thin film transistors may have a relatively high contact resistance (MΩ range) between the semiconductor layer and source/drain electrodes when compared to silicon thin film transistors. As a result, the relatively high contact resistance may render the injection of carriers ineffective, thus resulting in relatively low charge carrier mobility, relatively high driving voltage, and relatively high threshold voltage for the organic thin film transistors.

SUMMARY OF EXAMPLE EMBODIMENTS

An organic thin film transistor according to example embodiments may have a structure comprising an organic semiconductor layer and further comprising one or more gate electrodes, one or more source/drain electrodes, and/or a gate insulating layer provided on a substrate, wherein the organic semiconductor layer may comprise surface-modified carbon nanotubes and an electrically-conductive polymer. The organic thin film transistor may further comprise data lines and/or banks.

The surface-modified carbon nanotubes of the organic semiconductor layer may have surfaces modified with a curable functional group. The curable functional group may be an oxirane group or an anhydride group. The organic semiconductor layer may further comprise at least one additive selected from low-molecular weight and oligomeric organic semiconductor materials, thermal curing agents, coupling agents, dyes, flame retardants, wetting agents, dispersants, fillers, viscosity modifiers, photosensitive monomers, and other suitable additives. Additionally, the organic semiconductor layer may be provided by screen printing, printing, spin, casting, dipping, ink spraying, or laser deposition.

The organic thin film transistor according to example embodiments may be incorporated into a device. For example, the device may be a liquid crystal display, a plasma display, a field emission display, a light-emitting diode, or an organic electroluminescence (EL) display.

DETAILED DESCRIPTION OF EXAMPLE EMBODIMENTS

Figure 1:
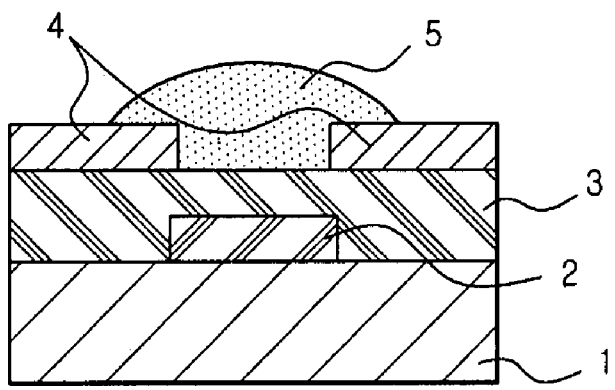
FIG. 1 is a cross-sectional view illustrating a bottom contact organic thin film transistor according to example embodiments.

Example embodiments will be described below in more detail with reference to the accompanying drawings. However, example embodiments may be embodied in different forms and should not be interpreted as limited to examples set forth herein.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Example embodiments relate to a transistor structure comprising a semiconductor layer having surface-modified carbon nanotubes. Example embodiments also relate to an organic thin film transistor having the above transistor structure, a substrate, a gate electrode, a gate insulating layer, and source/drain electrodes, wherein the organic semiconductor layer comprises surface-modified carbon nanotubes and an electrically-conductive polymer.

Referring to FIG. 1, the organic thin film transistor may have a bottom contact structure comprising a substrate 1, a gate electrode 2 disposed on the substrate 1, a gate insulating layer 3 disposed on the gate electrode 2 and substrate 1, source/drain electrodes 4 disposed on the gate insulating layer 3, and an organic semiconductor layer 5 disposed on at least a portion of the source/drain electrodes 4 and gate insulating layer 3. Alternatively, the organic semiconductor layer 5 may completely cover the source/drain electrodes 4 and gate insulating layer 3.

Figure 2:
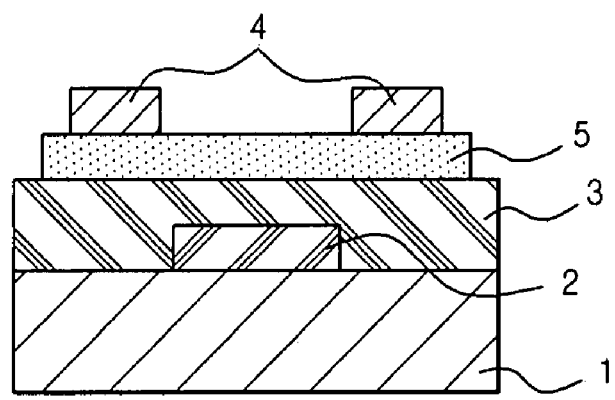
FIG. 2 is a cross-sectional view illustrating a top contact organic thin film transistor according to example embodiments.

Referring to FIG. 2, the organic thin film transistor may have a top contact structure comprising a substrate 1, a gate electrode 2 disposed on the substrate 1, a gate insulating layer 3 disposed on the gate electrode 2 and substrate 1, an organic semiconductor layer 5 disposed on the gate insulating layer 3, and source/drain electrodes 4 disposed on the organic semiconductor layer 5.

Figure 3:
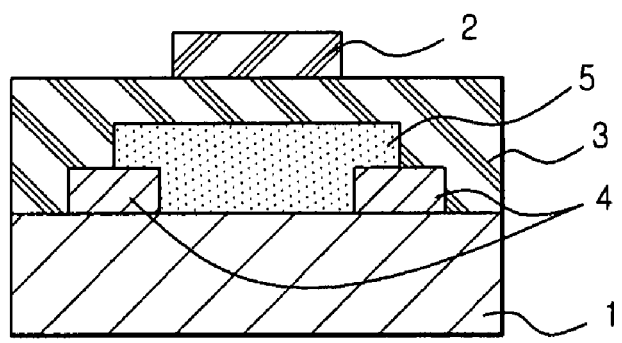
FIG. 3 is a cross-sectional view illustrating a top gate organic thin film transistor according to example embodiments.

Referring to FIG. 3, the organic thin film transistor may have a top gate structure comprising a substrate 1, source/drain electrodes 4 disposed on the substrate 1, an organic semiconductor layer 5 disposed on at least a portion of the source/drain electrodes 4 and substrate 1, a gate insulating layer 3 disposed on the organic semiconductor layer 5, source/drain electrodes 4, and substrate 1, and a gate electrode 2 disposed on the gate insulating layer 3. Alternatively, the organic semiconductor layer 5 may completely cover the source/drain electrodes 4 and substrate 1.

As discussed above, the organic semiconductor layer 5 may comprise surface-modified carbon nanotubes. Carbon nanotubes may exhibit properties of both a semiconductor and a metal. As a result, the contact resistance between the organic semiconductor layer 5 and source/drain electrodes 4 may be decreased when the organic semiconductor layer 5 comprises carbon nanotubes dispersed within a conductive polymer. Consequently, the decreased contact resistance facilitates the injection of carriers and results in an increase in the charge carrier mobility of the organic thin film transistor. Furthermore, the organic semiconductor layer may be provided using an economical and simple solution process that may be performed at room-temperature (e.g., spin casting).

However, carbon nanotubes may have a tendency to aggregate due to the presence of relatively high cohesive force between the carbon nanotubes, thus rendering it difficult to form an adhesive thin film with relatively uniform physical properties. To reduce aggregation, a dispersant may be added to improve the dispersability and solubility of the carbon nanotubes.

Rather than using a dispersant, aggregation may be reduced with the use of surface-modified carbon nanotubes. Modifying the surfaces of the carbon nanotubes with a functional group may help to maintain a relatively constant distance between the carbon nanotube particles, thus improving the dispersability and solubility of the carbon nanotubes, which may ultimately improve the electrical and physical properties of the organic semiconductor layer 5.

Functional groups that may be introduced onto the surfaces of the carbon nanotubes are not particularly restricted so long as they are not contrary to the teachings of the specification. For example, suitable functional groups may comprise curable functional groups (e.g., epoxy). Additionally, modifying the surfaces of the carbon nanotubes, comprised in an organic semiconductor layer 5, with a curable functional group may allow curing of the organic semiconductor layer 5, thus improving the adhesiveness of the organic semiconductor layer 5.

The curable functional group may an oxirane group represented by Formula 1:

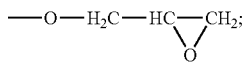  (1)

and/or an anhydride group represented by any one of Formulas 2 to 7:

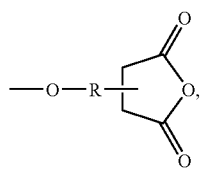  (2)

wherein R is a $C_1$-$C_{15}$ linear, branched, or cyclic alkylene group;

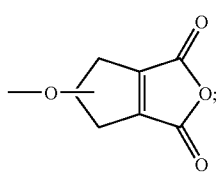  (3)

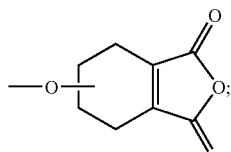  (4)

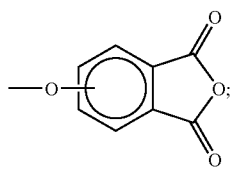  (5)

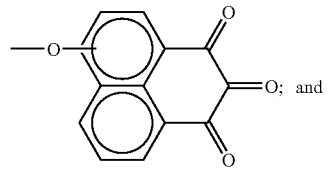  (6)

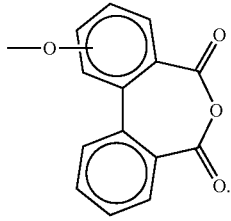  (7)

The carbon nanotubes surface-modified with the oxirane and/or anhydride group may be prepared by treating the surfaces of carbon nanotubes with an acid and introducing the oxirane and/or anhydride functional groups onto the surfaces of the carbon nanotubes.

For example, the surface modification of carbon nanotubes may be performed by the following procedure. Carbon nanotubes may be refluxed in a mixed acid solution of nitric acid and sulfuric acid at a volume ratio of about 1:9-9:1 (e.g., about 1:4-4:1) for about 24-120 hours and passed through a polycarbonate filter with a pore size of about 0.1-0.4 μm (e.g., 0.2 μm). The filtered materials may be refluxed in nitric acid at about 80-120° C. for about 45-60 hours, followed by centrifugation. The supernatant may be collected and passed through a filter. The filtered materials may be completely dried to obtain acid-treated carbon nanotubes. The acid-treated carbon nanotubes may be dispersed in distilled water or dimethylformaldehyde (DMF) and passed through a polycarbonate filter to separate the acid-treated carbon nanotubes of a particular size.

The acid-treated carbon nanotubes may be added to an organic solvent and homogeneously dispersed by sonication. Thionyl chloride may be added to the dispersion, which may be stirred at about 60-80° C. for about 20-30 hours to replace the hydroxyl radical of the carboxyl group introduced onto the surfaces of the acid-treated carbon nanotubes with a chlorine radical. This replacement may facilitate the introduction of an oxirane and/or anhydride group. After completion of the reaction, the reaction mixture may be diluted with anhydrous THF and centrifuged to separate a brown suspension, which may be decanted to obtain a precipitate. The precipitate may be purified by one or more washings with anhydrous THF. The remaining black solid may be dried under reduced pressure at about room temperature to yield carbon nanotubes substituted with chlorine. The chlorine-substituted carbon nanotubes may be dispersed in an organic solvent (e.g., chloroform or dimethylformamide) and refluxed with an oxirane compound (e.g., glycidol) in the presence of a base catalyst (e.g., pyridine) to yield carbon nanotubes having surfaces modified with an oxirane group.

Alternatively, the chlorine-substituted carbon nanotubes may be reacted with a dimethyl ester derivative having a hydroxyl group at one end of the molecule to obtain carbon nanotubes substituted with a dimethyl ester group. The substituted carbon nanotubes may be reacted with water in the presence of sodium hydroxide to form a dicarboxylic acid. The dicarboxylic acid may be condensed to yield carbon nanotubes having surfaces modified with an anhydride group. Unreacted materials may be removed by one or, more washings with methanol or a suitable solvent. The existence of the oxirane and/or anhydride functional groups on the modified surfaces the carbon nanotubes may be identified by Raman spectroscopy.

Regarding size, the carbon nanotubes may be in the micrometer range, but is not limited thereto. The carbon nanotubes may be selected from, but not limited to, single-walled carbon nanotubes, multi-walled carbon nanotubes (e.g., double-walled carbon nanotubes), rope carbon nanotubes, and mixtures thereof. Multi-walled carbon nanotubes may include the "Russian Doll" model, wherein sheets of graphite are arranged in concentric cylinders (e.g., smaller single-walled carbon nanotube within a larger single-walled nanotube). Multi-walled carbon nanotubes may also include the "Parchment" model, wherein a single sheet of graphite is rolled in around itself, resembling a scroll of parchment or a rolled up newspaper.

Double-walled carbon nanotubes may be beneficial in that they have desirable electrical properties similar to that of single-walled carbon nanotubes while possessing improved chemical resistance, which may be important during functionalization (surface modification with functional groups). For example, functionalization of a single-walled carbon nanotube may break some of its carbon bonds, thus leaving "holes" in the nanotube and potentially altering its mechanical and electrical properties. In contrast, functionalization of a double-walled carbon nanotube involves modification of the outer wall while leaving the inner wall relatively intact.

As discussed previously, the organic semiconductor layer may comprise surface-modified carbon nanotubes dispersed in an electrically-conductive polymer. The conductive polymer may comprise, but is not limited to, polythiophene, polyaniline, polyacetylene, polypyrrole, polyphenylene, polyphenylene vinylene, polythiophenethiazole, polythiazole, poly(3-alkyl)thiophene, polyfluorene, polyisocyanaphthalene, polyethylene dioxythiophene, poly(2,5-dialkoxy)-p-phenylenevinylene, polyparaphenylene, polyheptadiene, and derivatives thereof. The conductive polymers may be used alone or in combination with each other.

Taking into consideration the dispersability of the carbon nanotubes and the maintenance of the conductivity of the carbon nanotubes, the surface-modified carbon nanotubes may be mixed with the conductive polymer at a weight ratio of about 1:1-1:100. It may also be beneficial to mix the surface-modified carbon nanotubes with the conductive polymer at a weight ration of about 1:10-1:50.

The organic semiconductor layer may further comprise at least one additive selected from low-molecular weight and oligomeric organic semiconductor materials, thermal curing agents, coupling agents, dyes, flame retardants, wetting agents, dispersants, fillers, viscosity modifiers, photosensitive monomers, and other additives.

Examples of low-molecular weight and oligomeric organic semiconductor materials may comprise anthracene, tetracene, pentacene, oligothiophene, melocyanine, copper phthalocyanine, peryrene, rubrene, coronene, and anthradithiophene. Examples of thermal curing agents may comprise amines, anhydrides, imidazoles, arylphenols, carboxylic acids, polyamido-amine resins, polyamide resins, boron trifluoride, tris($\beta$-methylglycidyl)isocyanurate, bis($\beta$-methylglycidyl)terephthalate, and p-phenolsulfonic acid. Additionally, it may be beneficial to employ thermal curing agents for epoxy curing.

The surface-modified carbon nanotubes and electrically-conductive polymer may be dispersed in an organic solvent and applied by a room-temperature solution process to form a thin film. Examples of suitable organic solvents may comprise chlorobenzene, chloroform, dimethylformamide (DMF), toluene, terpineol, and N-methyl-2-pyrrolidone (NMP). These organic solvents may be used alone or in combination with each other. The room-temperature solution process may be a conventional room-temperature wet process. Examples of a room-temperature solution process may comprise screen printing, printing, spin casting, dipping, ink spraying, and laser deposition. In view of the relative ease of coating and relative uniformity of thickness, it may be beneficial to employ spin casting or printing. Regarding spin casting, the spin speed may be in the range of about 100-10,000 rpm.

The composition comprising the surface-modified carbon nanotubes and conductive polymer may further comprise an appropriate amount of an acid or base or may be subjected to ultrasonication to better stabilize the surface-modified carbon nanotubes dispersed in the organic solvent and to increase the solubility of the conductive polymer. The composition may be annealed using a conventional process to provide an organic semiconductor layer with enhanced adhesiveness. The annealing may be performed at about 50-300° C. for about 1 minute to about 10 hours. Additionally, the thickness of the organic semiconductor layer 5 may be in the range of about 300 to 2,000 Å, but is not limited thereto.

The substrate 1 may be silica, glass, plastic, or other suitable material. Examples of plastics may comprise polyethylenenaphthalate, polyethyleneterephthalate, polycarbonate, polyvinylbutyral, polyacrylate, polyimide, polynorbornene, and polyethersulfone substrates.

Suitable materials for the gate electrode 2 and the source/drain electrodes 4 may be metals, comprising gold (Au), silver (Ag), aluminum (Al), nickel (Ni), molybdenum (Mo), tungsten (W) and chromium (Cr); metal oxides, comprising indium-tin oxide (ITO) and indium-zinc oxide (IZO); and electrically-conductive polymers, comprising polythiophene, polyaniline, polyacetylene, polypyrrole, polyphenylene vinylene, and polyethylenedioxythiophene (PEDOT)/polystyrenesulfonate (PSS) mixtures. These materials may be used alone or in combination with each other. The gate electrode 2 and source/drain electrodes 4 may have a thickness of about 500-2,000 Å. The gate electrode 2 and the source/drain electrodes 4 may also be patterned by conventional techniques according to the intended applications and needs.

The gate insulating layer 3 may be an insulator with a relatively high dielectric constant. Suitable insulators may be ferroelectric insulators, comprising $Ba_{0.33}Sr_{0.66}TiO_3$ (BST), $Al_2O_3$, $Ta_2O_5$, $La_2O_5$, $Y_2O_3$, and $TiO_2$; inorganic insulators, comprising $PbZr_{0.33}Ti_{0.66}O_3$(PZT), $Bi_4Ti_3O_{12}$, $BaMgF_4$, $SrBi_2(TaNb)_2O_9$, $Ba(ZrTi)O_3$ (BZT), $BaTiO_3$, $SrTiO_3$, $Bi_4Ti_3O_{12}$, $SiO_2$, $SiN_x$, and AlON; and organic insulators, comprising polyimide, benzocyclobutene (BCB), parylene, polyacrylate, polyvinyl alcohol, and polyvinyl phenol. The thickness of the gate insulating layer 3 may be in the range of about 1,000-10,000 Å, but is not limited thereto. The gate insulating layer 3 may also be patterned by conventional techniques according to the intended applications and needs.

The organic thin film transistor according to example embodiments may further comprise data lines and/or banks.

A suitable metal or metal oxide may be used to form the data lines. For example, the data lines may be a material selected from metals, comprising gold, silver, aluminum, nickel, molybdenum, chromium, and alloys thereof; and metal oxides, comprising indium-tin oxide, indium-zinc oxide, and mixtures thereof. The thickness of the data lines may be in the range of about 1,000-3,000 Å, but is not limited thereto.

The banks may be provided for the organic semiconductor layer 5 and/or the source/drain electrodes 4. The thickness of the banks may be determined by those skilled in the art depending on the thickness of the organic semiconductor layer 5 and/or the source/drain electrodes 4. For example, the thickness of the banks may be in the range of about 3,000 Å to about 2 µm, but is not limited thereto.

The organic thin film transistor according to example embodiments may be employed in a variety of devices. For example, the device may be a display device, comprising a liquid crystal display, a plasma display, a field emission display, a light-emitting diode, or an organic electroluminescence (EL) display.

Example embodiments will be explained in more detail with reference to the following examples. However, these examples are merely provided for purposes of illustration and are not intended to limit example embodiments.

EXAMPLES

Preparative Example 1

Purification of Carbon Nanotubes 100 mg of carbon nanotubes (ILJIN CNT AP-Grade, ILJIN Nanotech Co., Ltd., Korea) were refluxed with 50 ml of distilled water at 100° C. for 12 hours in a 500 ml flask equipped with a reflux tube, and passed through a filter. The filtered materials were dried at 60° C. for 12 hours and washed with toluene to remove residual fullerene. The remaining soot was collected from the flask, heated in a furnace at 470° C. for 20 minutes, and washed with a 6 M hydrochloric acid solution to remove metallic impurities, thus yielding purified carbon nanotubes.

Preparative Example 2

Introduction of Carboxyl Group

The purified carbon nanotubes obtained in Preparative Example 1 were refluxed in a sonicator filled with a mixed acid solution of nitric acid and sulfuric acid (7:3 (v/v)) for 24 hours and passed through a 0.2 μm polycarbonate filter. The filtered materials were refluxed in nitric acid at 90° C. for 45 hours, followed by centrifugation at 12,000 rpm. The supernatant was passed through a 0.1 μm polycarbonate filter and dried at 60° C. for 12 hours. The dried carbon nanotubes were dispersed in dimethylformamide (DMF) and passed through a 0.1 μm polycarbonate filter to screen the carbon nanotubes having a size larger than 0.1 μm.

Preparative Example 3

Introduction of Acetyl Chloride Group on Surface of Carbon Nanotubes 0.03 g of the carbon nanotubes surface-modified with a carboxyl group, which were prepared in Preparative Example 2, were homogeneously dispersed in a flame dried two-neck Schrenk flask containing 20 ml of DMF by sonication under a nitrogen atmosphere for one hour. 20 ml of thionyl chloride was added to the dispersion and allowed to react with stirring at 70° C. for 24 hours. After completion of the reaction, the reaction mixture was diluted with anhydrous THF and centrifuged to separate a brown suspension. The suspension was decanted away to obtain pellets. The pellets were purified by washing three times with anhydrous THF. The remaining black solid was dried under reduced pressure at room temperature.

Preparative Example 4

Introduction of Oxirane Group into Surfaces of Carbon Nanotubes 40 mg of the carbon nanotubes surface-modified with an acetyl chloride group, which were prepared in Preparative Example 3, were dispersed in 20 ml of chloroform by sonication for 30 minutes. 4 ml of pyridine and 1 ml of glycidol were sequentially added to the dispersion. The mixture was allowed to react with stirring under refluxing conditions for 48 hours. After completion of the reaction, the reaction mixture was washed several times with methanol to remove unreacted glycidol, and the remaining black solid was dried under reduced pressure at room temperature to yield carbon nanotubes whose surfaces were modified with a glycidyl ether group.

Preparative Example 5

Introduction of Anhydride Group into Surfaces of Carbon Nanotubes 40 mg of the carbon nanotubes surface-modified with an acetyl chloride group, which were prepared in Preparative Example 3, were dispersed in 2 ml of dimethylformamide by sonication. 10 ml of pyridine and 2 g of dimethyl 4-hydroxyphthalate were sequentially added to the dispersion. The mixture was allowed to react at 70° C. for about 18 hours. After completion of the reaction, the reaction mixture was washed several times with distilled water. 20 ml of acetone and 10 ml of a solution of sodium hydroxide (0.2 g) in distilled water were sequentially added to the remaining black solid. The mixture was allowed to react with stirring at 60° C. for about 18 hours. After completion of the reaction, the reaction mixture was washed several times with a dilute aqueous hydrochloric acid solution, distilled water, and ethyl acetate, and dried under reduced pressure at room temperature. The dried solid was reacted with 5 ml of acetic acid and 5 ml of acetic anhydride at 125° C. for 8 hours, washed several times with methanol to remove unreacted materials, and dried under reduced pressure at room temperature, thus yielding nanotubes whose surfaces were modified with an anhydride group.

[Fabrication of Organic Thin Film Transistors]

Example 1

Polythiophene-thiazole (weight average molecular weight: 15,000) was dissolved in chlorobenzene or chloroform to obtain a polymer solution (1 mg/mL). The carbon nanotubes surface-modified with an oxirane group, which were prepared in Preparative Example 4, were dispersed in a mixed solvent of dimethylformamide and chloroform to obtain a solution of the carbon nanotubes (1 mg/ML). The polymer solution was mixed with the solution of the carbon nanotubes in a weight ratio of 1:1 to prepare a solution for the formation of an organic semiconductor layer 5.

Aluminum (Al) was deposited to a thickness of 1,000 Å on a clean glass substrate 1 by sputtering to form a gate electrode 2. An organic-inorganic hybrid insulating material was applied by spin casting and dried at 200° C. for 2 hours to form a 7,000 Å-thick gate insulating layer 3. Gold (Au) was deposited to a thickness of 700 Å on the gate insulating layer by thermal evaporation to form source/drain electrodes 4. The solution prepared above was spin-cast at 1,000 rpm on the source/drain electrodes 4 and the gate insulating layer 3 to form a 700 Å-thick organic semiconductor layer 5. The resulting structure was annealed at 100° C. for one hour to complete the fabrication of an organic thin film transistor.

Example 2

An organic thin film transistor was fabricated in the same manner as in Example 1, except that the carbon nanotubes surface-modified with an anhydride group, which were prepared in Preparative Example 5, were used instead of the carbon nanotubes surface-modified with an oxirane group.

Example 3

An organic thin film transistor was fabricated in the same manner as in Example 1, except that the polymer solution was mixed with the solution of the carbon nanotubes at a weight ratio of 50:1 to prepare a solution for the formation of an organic semiconductor layer 5.

Comparative Example 1

An organic thin film transistor was fabricated in the same manner as in Example 1, except that a solution of polythiophene-thiazole without any carbon nanotubes was used as the solution for the formation of a semiconductor layer.

Comparative Example 2

An organic thin film transistor was fabricated in the same manner as in Example 1, except that the purified carbon nanotubes prepared in Preparative Example 1 were used instead of the carbon nanotubes surface-modified with an oxirane group.

[Evaluation of Electrical Properties of Organic Thin Film Transistors]

To evaluate the electrical properties of the organic thin film transistors fabricated in Example 1 and Comparative Examples 1 and 2, the current transfer characteristics of the devices were measured using a semiconductor characterization system (4200-SCS, KEITHLEY). The results are plotted in FIGS. 4 and 5.

Figure 4:
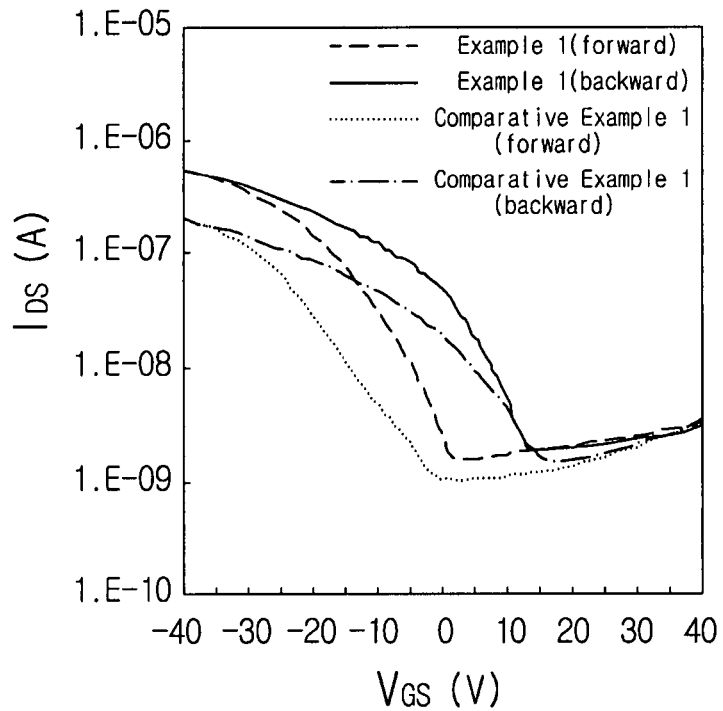
FIG. 4 is a graph showing the current transfer characteristics of organic thin film transistors fabricated in Example 1 and Comparative Example 1.
Figure 5:
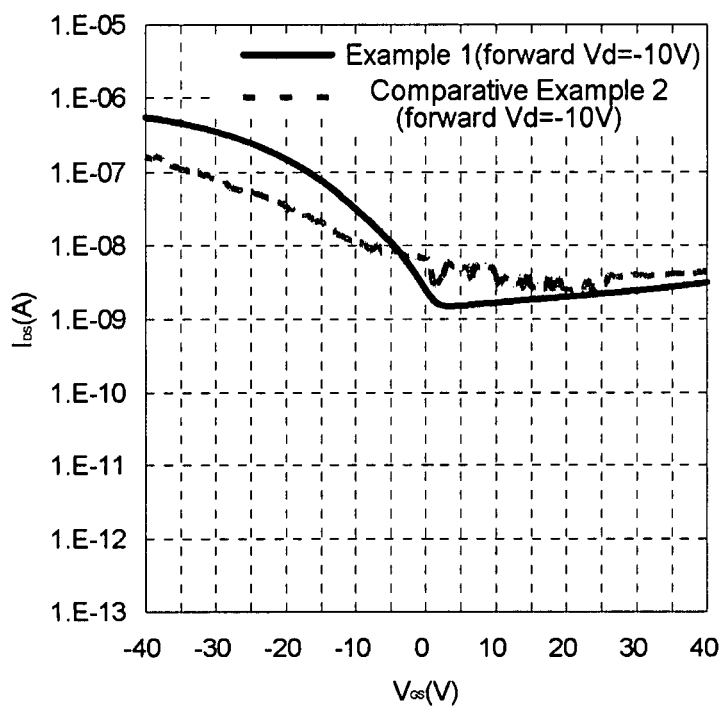
FIG. 5 is a graph showing the current transfer characteristics of organic thin film transistors fabricated in Example 1 and Comparative Example 2.

Referring to FIG. 4, the on-current of the organic thin film transistor fabricated in Example 1, which comprised an organic semiconductor layer 5 having surface-modified carbon nanotubes, is shown (in Table 1, discussed below) to be more than two times higher than that of the organic thin film transistor fabricated in Comparative Example 1, which used no carbon nanotubes. Additionally, this result demonstrates an improvement in charge carrier mobility (as shown in Table 1, discussed below). Referring to FIG. 5, the organic thin film transistor fabricated in Comparative Example 2, which comprised an organic semiconductor layer having purified (rather than surface-modified) carbon nanotubes, showed no gate-voltage effect (as shown in Table 1, discussed below).

The charge carrier mobility, on-current ($I_{on}$), and threshold voltage ($V_t$) of each of the organic thin film transistors fabricated in Examples 1 to 3 and Comparative Examples 1 and 2 were measured as follows, and the results are shown in Table 1.

The charge carrier mobility of the devices was calculated from the slope of a graph representing the relationship between $(I_{SD})^{1/2}$ and $V_G$, which was plotted from the following current equations in the saturation region:

$$I_{SD} = \frac{WC_0}{2L}\mu(V_G - V_T)^2$$

$$\sqrt{I_{SD}} = \sqrt{\frac{\mu C_0 W}{2L}}(V_G - V_T)$$

$$\text{slope} = \sqrt{\frac{\mu C_0 W}{2L}}$$

$$\mu_{FET} = (\text{slope})^2 \frac{2L}{C_0 W}$$

In the above equations, $I_{SD}$=source-drain current, $\mu$ and $\mu_{FET}$=charge carrier mobility, $C_o$=capacitance of oxide film, W=channel width, L=channel length, $V_G$=gate voltage, and $V_T$=threshold voltage.

The on-current ($I_{on}$) was determined as the maximum amount of current.

TABLE 1

| Example No. | Charge carrier mobility | $I_{on}$ (at $V_{ds}$ = −10 V) |
|---|---|---|
| Example 1 | 0.02 (at linear region) 0.035 (at saturation region) | $5.5 \times 10^{-7}$ A |
| Example 2 | 0.018 (at linear region) 0.032 (at saturation region) | $5.0 \times 10^{-7}$ A |
| Example 3 | 0.013 (at linear region) 0.019 (at saturation region) | $2.6 \times 10^{-7}$ A |
| Comparative Example 1 | 0.01 (at linear region) 0.016 (at saturation region) | $1.9 \times 10^{-7}$ A |
| Comparative Example 2 | No effect (N/A) | No effect (N/A) |

As shown in Table 1, the organic thin film transistors fabricated in Examples 1 to 3 according to example embodiments showed improved electrical properties, including charge carrier mobility and on-current.

Accordingly, a relatively uniform and relatively highly-adhesive organic semiconductor layer 5 may be provided in a simple and economical manner with a room-temperature solution process using surface-modified carbon nanotubes and an electrically-conductive polymer. Additionally, the organic semiconductor layer 5 may be used to fabricate an organic thin film transistor having relatively high charge carrier mobility and relatively low threshold voltage.

While example embodiments have been disclosed herein, other variations may be possible. Such variations are not to be regarded as a departure from the spirit and scope of example embodiments of the present invention, and all such modifications as would be obvious to one skilled in the art are intended to be included within the scope of the following claims.

What is claimed is:

1. A transistor structure comprising:
   an organic semiconductor layer including surface-modified carbon nanotubes and an electrically-conductive polymer,
   wherein the surface-modified carbon nanotubes have surfaces modified with a curable functional group, the curable functional group being directly bound to the carbon nanotubes through an oxygen atom of the curable functional group.

2. The transistor structure of claim 1, wherein the curable functional group is an oxirane group represented by Formula 1:

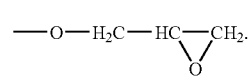

(1)

3. The transistor structure of claim 1, wherein the curable functional group is an anhydride group represented by one of Formulas 2 to 7:

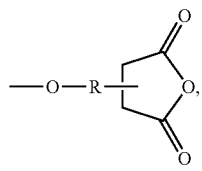
(2)

wherein R is a $C_1$-$C_{15}$ linear, branched, or cyclic alkylene group;

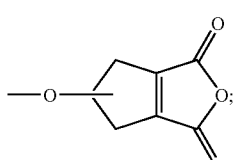
(3)

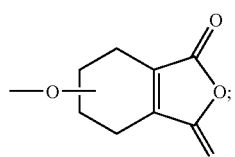
(4)

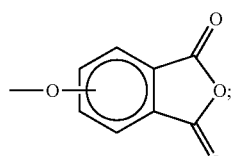
(5)

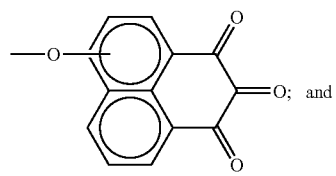
(6)

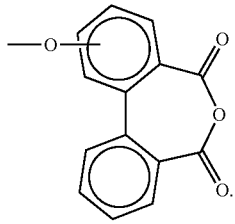
(7)

4. The transistor structure of claim 1, wherein the carbon nanotubes are at least one of single-walled carbon nanotubes, multi-walled carbon nanotubes, and rope carbon nanotubes.

5. The transistor structure of claim 4, wherein the multi-walled carbon nanotubes are double-walled carbon nanotubes.

6. The transistor structure of claim 1, wherein the electrically-conductive polymer is selected from the group consisting of polythiophene, polyaniline, polyacetylene, polypyrrole, polyphenylene, polyphenylene vinylene, polythiophenethiazole, polythiazole, poly(3-alkyl) thiophene, polyfluorene, polyisocyanaphthalene, polyethylene dioxythiophene, poly(2, 5-dialkoxy) -p -phenylenevinylene, polyparaphenylene, polyheptadiene, and derivatives thereof.

7. The transistor structure of claim 1, wherein the surface-modified carbon nanotubes and the electrically-conductive polymer are present in a weight ratio of about 1:1-1:100.

8. The transistor structure of claim 1, wherein the organic semiconductor layer further comprises at least one additive selected from the group consisting of low-molecular weight and oligomeric organic semiconductor materials, thermal curing agents, coupling agents, dyes, flame retardants, wetting agents, dispersants, fillers, viscosity modifiers, and photosensitive monomers.

9. The transistor structure of claim 8, wherein the low-molecular weight and oligomeric organic semiconductor materials are anthracene, tetracene, pentacene, oligothiophene, melocyanine, copper phthalocyanine, peryrene, rubrene, coronene, or anthradithiophene.

10. The transistor structure of claim 8, wherein the thermal curing agents are amines, anhydrides, imidazoles, arylphenols, carboxylic acids, polyamido-amine resins, polyamide resins, boron trifluoride, tris(β-methylglycidyl)isocyanurate, bis(β-methylglycidyfl)terephthalate, or p-phenolsulfonic acid.

11. The transistor structure of claim 1, wherein the organic semiconductor layer is provided by screen printing, printing, spin casting, dipping, ink spraying, or laser deposition.

12. An organic thin film transistor, comprising:
the transistor structure of claim 1.

13. The transistor of claim 12, further comprising:
a substrate;
a gate electrode;
a gate insulating layer; and
a source electrode and a drain electrode.

14. The transistor of claim 13, wherein the transistor has a bottom contact structure.

15. The transistor of claim 13, wherein the transistor has a top contact structure.

16. The transistor of claim 13, wherein the transistor has a top gate structure.

17. The transistor of claim 13, further comprising at least one of data lines and banks.

18. A device comprising the organic thin film transistor of claim 12.

19. The device of claim 18, wherein the device is a liquid crystal display, a plasma display, a field emission display, a light-emitting diode, or an organic electroluminescence (EL) display.

* * * * *